(12) United States Patent
Schroeder et al.

(10) Patent No.: US 7,049,241 B2
(45) Date of Patent: May 23, 2006

(54) METHOD FOR FORMING A TRENCH IN A LAYER OR A LAYER STACK ON A SEMICONDUCTOR WAFER

(75) Inventors: Uwe Paul Schroeder, Hopewell Junction, NY (US); Matthias Goldbach, Dresden (DE); Tobias Mono, Dresden (DE)

(73) Assignee: Infineon Technologies AG, Munich (DE)

( * ) Notice: Subject to any disclaimer, the term of this patent is extended or adjusted under 35 U.S.C. 154(b) by 23 days.

(21) Appl. No.: 10/937,099

(22) Filed: Sep. 8, 2004

(65) Prior Publication Data

US 2005/0106890 A1     May 19, 2005

(30) Foreign Application Priority Data

Sep. 8, 2003   (DE) ................................ 103 41 321

(51) Int. Cl.
    *H01L 21/302*    (2006.01)
    *H01L 21/461*    (2006.01)
(52) U.S. Cl. ........................ 438/705; 438/924; 438/694
(58) Field of Classification Search ................ 438/705, 438/924, 738, 694
See application file for complete search history.

(56) References Cited

U.S. PATENT DOCUMENTS

| | | | |
|---|---|---|---|
| 6,326,300 B1 | 12/2001 | Liu et al. | |
| 6,596,642 B1 * | 7/2003 | Wu et al. | 438/705 |
| 6,642,152 B1 * | 11/2003 | Ng et al. | 438/717 |
| 6,653,231 B1 * | 11/2003 | Okoroanyanwu et al. | 438/669 |
| 6,875,664 B1 * | 4/2005 | Huang et al. | 438/299 |
| 6,930,030 B1 * | 8/2005 | Rausch et al. | 438/589 |
| 2003/0129837 A1 | 7/2003 | Enders | |

* cited by examiner

*Primary Examiner*—Caridad Everhart
(74) *Attorney, Agent, or Firm*—Slater & Matsil, L.L.P.

(57) ABSTRACT

Preferably using a positive resist, a resist ridge (20) is formed in a photosensitive resist (16) applied on a semiconductor wafer (1) above a hard mask layer (12). The resist ridge (20) serves as a mask for a subsequent implantation step (46). This makes use of an effect whereby the material of the hard mask layer (12), in a part (122) shaded by the resist ridge (20), can be etched out selectively with respect to the implanted part (121). The consequently patterned hard mask layer is used as an etching mask with respect to an underlying layer or layer stack (102–104) that is actually to be patterned. From the resist ridge (10) that has been formed as a line in the photosensitive resist (16), in a type of tone reversal, an opening (24) has been formed in the hard mask layer and a trench (26) has been formed in the layer/layer stack (102–104). According to the invention, the width (51, 52) of the resist ridge (20) is reduced by exposing the resist ridge (20) to an oxygen plasma (42). As a result, it is possible to form a trench (26) in the hard mask layer (12) and in the layer/layer stack (102–104) the width (52) of which trench is smaller than the lithographic resolution limit during the lithographic patterning of the resist (16).

20 Claims, 5 Drawing Sheets

METHOD FOR FORMING A TRENCH IN A LAYER OR A LAYER STACK ON A SEMICONDUCTOR WAFER

This application claims priority to German Patent Application 103 41 321.9, which was filed Sep. 8, 2003 and is incorporated herein by reference.

TECHNICAL FIELD

The invention relates to a method for forming a trench in a layer or a layer stack on a semiconductor wafer. The invention relates in particular to the patterning of insulated trenches or gaps in a photosensitive resist arranged on the wafer, and to the transfer thereof into an underlying layer or layer stack with the aid of an etching process.

BACKGROUND

Forming lines or gaps with extremely small structure widths represents one of the major challenges in the fabrication of integrated circuits. This applies in particular to the fabrication of memory cell arrays with volatile or non-volatile memory concepts. If the minimum structure widths of insulated or semi-insulated line structures that can be achieved in the course of processing are compared with those of insulated or semi-insulated trench structures, then it is possible to ascertain considerably better results on the part of line patterning. This holds true for the line structures that are exposed in a resist and developed after the step of development as resist ridges, and also for the structures that are transferred from the resist ridges into an underlying layer in an etching process.

Hereinafter, the terms lines and ridges, and respectively gaps and trenches, are in each case intended to be used synonymously.

This is caused by fundamental optical effects, which adversely affect the result to a lesser extent precisely in the case of insulated or semi-insulated lines. However, there are some memory cell concepts that rely on the patterning of gap or trench structures. One example thereof may be found in the so-called NROM (non-volatile read-only memory) cell concepts.

It is endeavored, therefore, to implement the fabrication of trench structures with exposure steps that are carried out in projection apparatuses of particularly high resolution, in order to compensate for this disadvantage. However, the requisite outlay is very high, in particular the costs of such projection apparatuses also playing an important part. Moreover, the process window that can also be achieved with these apparatuses is very small on account of the property of the trenches that the latter are present in insulated or semi-insulated fashion, and this may give rise to bridges in the resist and/or poor contrast in the image produced in the resist. Therefore, a lithography with projection apparatuses having the 157 nm or 193 nm wavelength does not constitute a suitable solution approach.

One alternative is to use projection apparatuses having lower resolution, i.e., having exposure wavelengths in the deep ultraviolet wavelength range (DUV), for example 248 nm, in combination with so-called shrink technologies. These include the use of silylation techniques (CARL), resist reflow techniques or techniques in which gaps or contact holes are reduced in size by the reaction of a chemical with the patterned resist. However, such techniques are not yet entirely mature at the present time, with the result that intolerable CD variations (CD: critical dimension) may occur precisely in the limit range of extremely minimal structure widths.

Instead of combining deep ultraviolet exposure with shrink technology, the latter may also be combined with the use of a negative resist. Insulated and opaque lines arranged on a mask provided for the projection lead to shaded line regions in the resist on the wafer. However, it is not the exposed regions around the line, but rather the unexposed regions of the line itself, which are stripped out in the subsequent development process. The advantage that occurs due to the reduction of the fundamental optical effects mentioned above is cancelled, however, by the disadvantage of the unfavorable resolution properties that are inherent to all known and commercially available negative resists.

In accordance with an integrative solution, a so-called spacer process is introduced in addition to a low-resolution lithography step (e.g., DUV lithography) during the post processing. Comparatively, wide trenches formed in the lithography step are overgrown by a small thickness from the side by the deposition of a thin layer, for example made of oxide. The thin layer is subsequently etched back anisotropically in large-area fashion. The layer that has grown laterally at the trench walls and remains after the etching-back step is referred to as spacer. The width remaining in the trench can be set by control of the deposition and etching process. In the case of this solution approach, too, the costs are very high because it is necessary to introduce an additional deposition and etching process in the fabrication sequence. The line width fluctuations also rise as a result of the multiplicity of processes. Consequently, tolerances that are usually prescribed can often no longer be complied with. Moreover, the additional deposition and etching processes lead to contamination problems.

SUMMARY OF THE INVENTION

In one aspect, the present invention provides a method to fabricate insulated or semi-insulated trenches with a high degree of uniformity with regard to trench widths formed. The cost investment is lowered in comparison with the prior art. Also, the minimum trench widths that can be achieved are reduced further. The availability of equipment, for example for memory fabrication, is improved by the use of conventional projection apparatuses.

In one preferred embodiment, a method for forming a trench in a layer or a layer stack on a semiconductor wafer includes the following steps:

provision of the semiconductor wafer with the layer or the layer stack, on which a hard mask layer and a photosensitive resist are arranged;

exposure of the photosensitive resist and development for the formation of at least one resist ridge arranged above the hard mask layer;

reduction of the width of the resist ridge by exposing the resist ridge to an oxygen plasma;

implantation of a first portion of the hard mask layer with dopant particles, a second portion of the hard mask layer that is shaded by the resist ridge not being implanted;

removal of the resist ridge;

stripping-out of the second, non-implanted portion of the hard mask layer selectively with respect to the first, implanted portion for the formation of an opening in the hard mask layer; and anisotropic etching of the layer or the layer stack selectively with respect to the hard mask layer for the purpose of transferring the opening into the layer or the layer stack for the formation of the trench.

Preferably using a positive resist, a resist ridge, i.e., a line, is formed in the photosensitive resist. The resist ridge serves as a mask with respect to dopant particles that are subsequently to be implanted. This makes use of the effect whereby the material of the underlying layer, in a part shaded by the resist ridge, can be etched selectively with respect to the implanted part. The consequently patterned underlying layer is itself in turn used as a hard mask layer. The hard mask layer is used as a mask with respect to the underlying layer or layer stack that is actually to be patterned. Consequently, from the resist ridge that has been formed as a line in the photosensitive resist, in a type of tone reversal, it is possible to form an opening in the hard mask layer and subsequently a trench with high dimensional accuracy and uniformity in the case of small structure dimensions in the layer or a layer stack.

This aspect of the invention combines the advantages of the possible use of positive resists in the case of only low-resolution lithography by the formation of lines in the resist with a tone reversal using an implantation mask and a hard mask layer.

Tone reversal means here that structures formed as lines or ridges in the resist are converted into gaps or trenches in an underlying layer. In this case, the word "tone" is used analogously to the opaque ridges/lines on a mask, which are formed in transparent surroundings free of structure elements on the mask.

In accordance with a particularly advantageous refinement of the aspect of tone reversal, the resist ridge formed photolithographically is exposed to an oxygen plasma prior to the implantation in a so-called $O_2$ flash, so that its width can be reduced in a controlled manner depending on the duration and the intensity of the plasma process. The combination of tone reversal with such a shrink process of resist ridges makes it possible to form trenches having widths down to 50–60 nm.

This step of exposing the resist ridge to an oxygen plasma makes it possible to form the resist ridge originally in exposure steps at wavelengths of 248 nm or more (deep ultraviolet light, DUV). A multiplicity of insulated or semi-insulated resist ridges can consequently be formed with high uniformity. Using for example oblique light illumination or phase masks, preferably halftone phase masks, the exposed and developed resist ridges, prior to the oxygen plasma step, can therefore be fabricated with widths in a range of 110–130 nm, from which the reduced trench widths are obtained in the underlying layer or layer stack in further process steps.

In some embodiments, the invention provides a method having the features of forming a trench in a layer or a stack layer. In this case, in an exposure process, which, however, is subject to the fundamental optical effects mentioned, a gap is formed instead of a ridge in the photosensitive resist. The resist area surrounding the gap is subsequently used as an implantation mask and the implanted portion of the underlying hard mask layer is stripped out selectively with respect to the non-implanted portion. As a result, a resist gap is converted into a trench in the hard mask and ultimately also the underlying layer or the underlying layer stack. This aspect will hereinafter be referred to as "tone-identical" trench formation.

This document designates as insulated or semi-insulated structures those which, although they may be arranged periodically, are far removed from a line/gap ratio of 1:1. A ratio of 1:2 is to be defined as a limit here, i.e., the trench width takes up less than 33% of the pitch of a grid-like structure of "lines" and trenches (pitch=grid spacing).

The invention in accordance with the aspect of tone reversal proves to be able to be realized particularly cost-effectively. No deposition and thus no formation of spacers are necessary. It is possible to make relaxed requirements of the selection of the projection apparatuses, and the tone reversal is implemented particularly dimensionally accurately on account of the generally small extent of lateral scattering of dopant particles during the implantation step. The resists that are currently used are formed with resist thicknesses, for example starting from 100 nm, which enable a sufficient absorption of the dopant particles in the implantation step. Consequently, there is no need to make any additional requirements of the resist for carrying out the implantation.

Further advantageous refinements with respect to the methods mentioned, in particular for the choice of material for the hard mask layer, the dopant and also the etchant for selectively stripping out undoped material with respect to doped material of the hard mask layer can be gathered from the drawings and the following description of the drawings.

BRIEF DESCRIPTION OF THE DRAWINGS

The invention will now be explained in more detail on the basis of exemplary embodiments with the aid of drawings, in which:

FIG. 1, which includes

FIG. 2, which includes FIG. 3, which includes

DETAILED DESCRIPTION OF ILLUSTRATIVE EMBODIMENTS

Figure 1A:
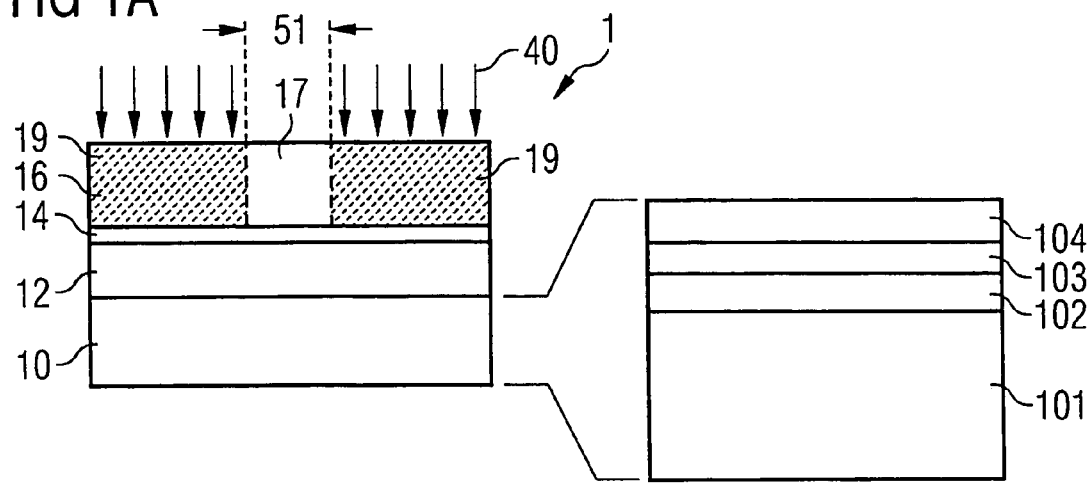
FIGS. 1a through 1h, shows a sequence of process steps according to the invention for forming a trench in a layer or a layer stack by means of tone reversal.

FIG. 1 shows a first exemplary embodiment of the method according to the invention in a sequence of process steps. FIG. 1a illustrates the state after the provision of a semiconductor wafer 1 when carrying out an exposure step 40. The semiconductor wafer 1 comprises a coated substrate 10, a hard mask layer 12, an antireflection layer 14 (ARC, antireflection coating) and also a photosensitive resist 16, which is a positive resist. In the case of a positive resist, exposed resist portions are stripped out in a developer step.

The enlargement on the right-hand side of FIG. 1a diagrammatically shows the construction of the coated substrate 10. Situated on the silicon substrate 101 is a layer stack, comprising a first oxide layer 102, a nitride layer 103 and a second oxide layer 104. The layers 102-104 form a layer stack, a so-called ONO layer. Such a layer stack may be used for example for the nonvolatile storage of electrical charges in NROM memories.

The hard mask layer 12 of this exemplary embodiment comprises amorphous polysilicon.

The exposure 40 is carried out using light having the wavelength of 248 nm. By way of example, an opaque chromium ridge is arranged on a mask used for the exposure 40, so that a region 17 in the photosensitive resist 16 having a width 51 of 130 nm remains unexposed. The mask may also be a half tone phase mask, the numerical aperture of the projection apparatus is 0.7, and oblique light illumination was set for the illumination.

Figure 1B:
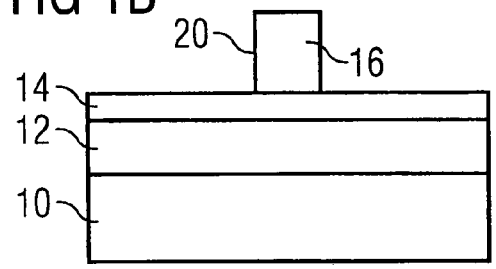

FIG. 1b shows the state after the removal of the exposed regions 19 in the resist 16 after carrying out a developer step. A resist ridge 20 remains on the antireflection layer 14. The antireflection layer 14 serves to avoid interferences within the resist 16 and has only a secondary influence on the effect that is to be achieved by the invention. In principle, the antireflection layer 14 may also be omitted for the method according to the invention.

Figure 1C:
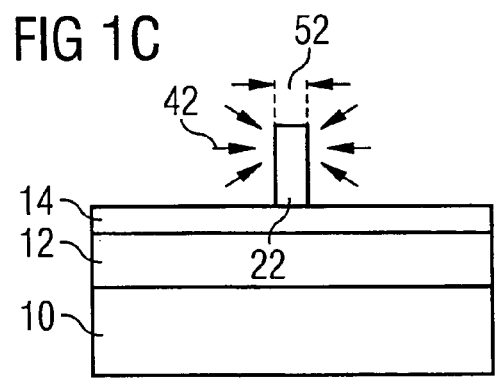
Figure 1D:
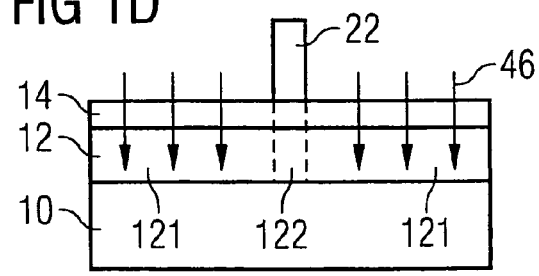

The resist ridge 20 is subsequently exposed to an oxygen plasma 42, as is shown in FIG. 1c. The resist ridge 20 is thereby thinned and converted into a narrower resist ridge 22. The width 52 of the latter is only 60 nm.

Next, an implantation 46 using boron is carried out. In this case, the resist ridge 22 serves as an implantation mask, and a region 122 beneath the resist ridge 22 within the hard mask layer 12, i.e., the amorphous polysilicon, is therefore not permeated with boron particles as dopant. By contrast, a portion 121 of the hard mask layer 12, which is not covered by the resist ridge 22, is implanted with boron. The thickness of the resist ridge 22 is at least 100 nm. The implantation energy is a few keV, for example between 1 and 10 keV. The implantation direction is perpendicular to the surface of the semiconductor wafer, i.e., the surface of the antireflection layer 14. As a result, the portion 122 in the hard mask layer 12 acquires the least cross-sectional area. Given the low implantation energies used here, the lateral scattering of the boron particles is at most 5 nm, so that the width 52 of the resist ridge 22 is transferred comparatively dimensionally accurately into the hard mask layer 12.

Figure 1E:
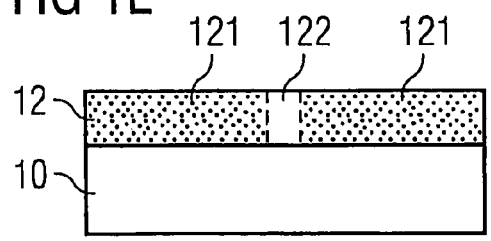

FIG. 1e shows the state after the removal of the resist layer 16, i.e., of the resist ridge 22, and also of the antireflection layer 14.

Figure 1F:
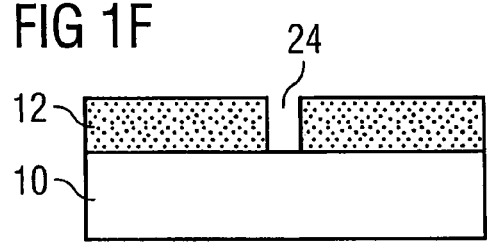

By means of an alkaline etching method, preferably using KOH or NH$_4$OH, the undoped or non-implanted polysilicon in the portion 122 of the hard mask layer 12 is then stripped out selectively with respect to the surrounding polysilicon implanted with boron in the portion 121, as is illustrated in FIG. 1f.

Figure 1G:
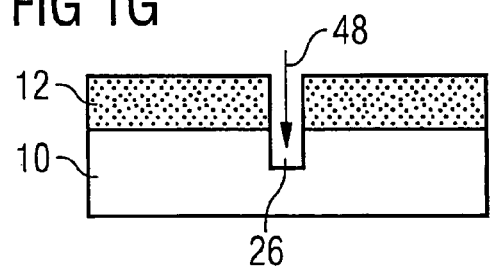

Afterward, as can be seen in FIG. 1g, an anisotropic etching step 48 is carried out, preferably a dry etching process, by means of which the trench 24 formed in the hard mask layer 12, i.e., the implanted polysilicon, is transferred into the coated substrate 10 for the formation of a recessed trench 26.

Figure 1H:
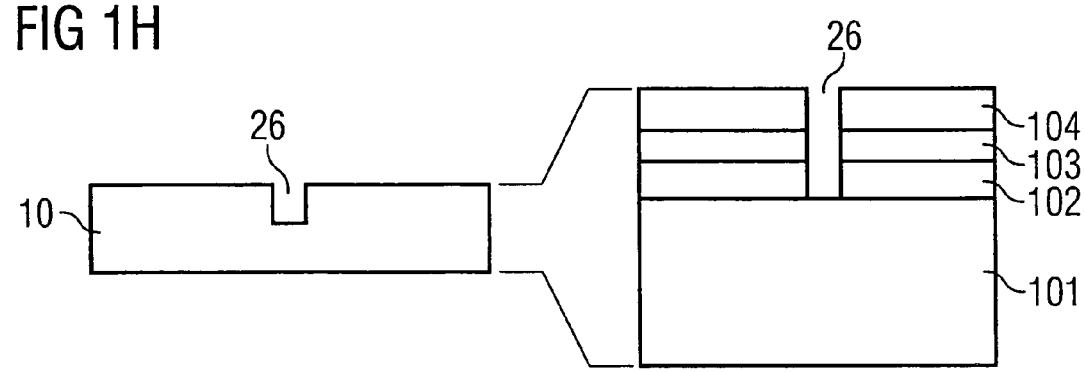

FIG. 1h shows the state after the removal of the hard mask layer 12 by means of an etching process that removes silicon selectively with respect to an oxide. The enlarged detail on the right-hand side of FIG. 1h shows the trench 26 formed in the ONO layer, which trench reaches down as far as the silicon substrate 101.

In this exemplary embodiment, using amorphous polysilicon for the hard mask layer 12, the dopant used may also be boron fluoride (BF$_2$), indium and, if appropriate, also arsenic, phosphorus and antimony. In all these cases, the alkaline etchant mentioned is preferably to be used, the selection not being limited to the two particularly advantageous substances mentioned.

The material of the hard mask layer 12 is also selected depending on what underlying material of the layer to be patterned or of the layer stack to be patterned is to be provided with a trench. By way of example, if silicon is to be patterned, then SiO$_2$ (arbitrary glass types) is appropriate for the hard mask layer 12. Fluorine or fluoride is taken into consideration here as implantation material. HF, BHF, DHF is then used as a relevant etchant.

Furthermore, it is also possible to use undensified aluminum oxide (Al$_2$O$_3$) for the hard mask layer 12. Argon and xenon and also other heavy ions are appropriate here as implantation materials. A suitable etchant is SCl.

Figure 2A:
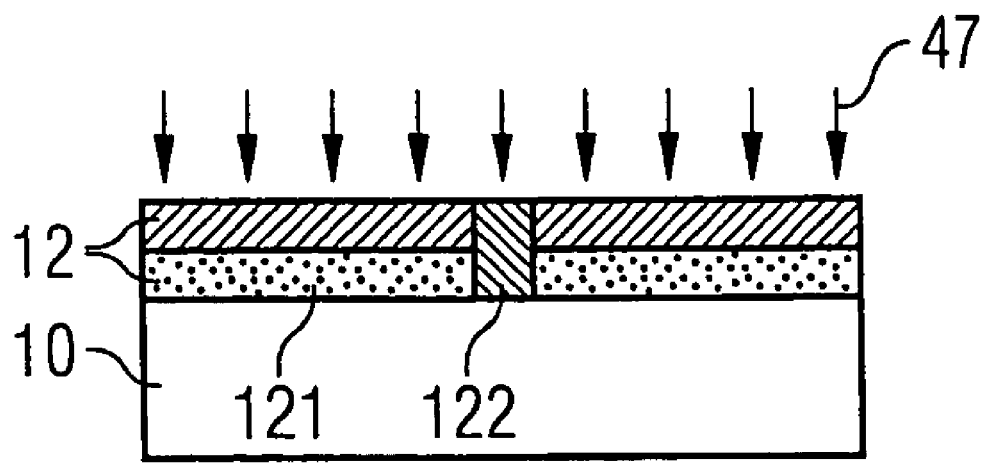
FIGS. 2a and 2b, shows a further exemplary embodiment according to the invention, which shows a modification of the process sequence from FIG. 1.

A further alternative is afforded by the following process sequence: instead of the implantation 46 with boron particles (FIG. 1d) the amorphous polysilicon, i.e., the hard mask layer 12, is implanted with nitrogen particles. After the removal of the resist ridge 22, a further intermediate step that is affected is an oxidation of the polysilicon in the hard mask layer 12—either only superficially or in a manner relating to the entire layer. The result of an oxidation 47 is illustrated in exemplary fashion in FIG. 2 on the basis of the hatched region in the hard mask layer 12. The oxidation takes place particularly effectively in the non-implanted silicon of the portion 122 beneath the former resist ridge 22. The oxidation 47 is less effective in the nitrogen-implanted regions, i.e., of the non-implanted portion 121 of the hard mask layer 12 (FIG. 2a).

Figure 2B:
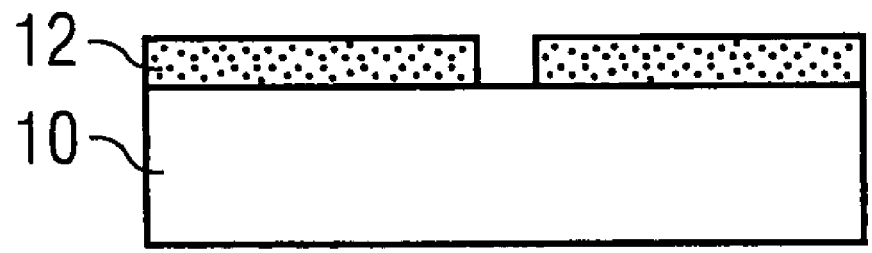

FIG. 2b shows the state after the oxide then produced has been etched selectively with respect to the essentially non-oxidized, nitrogen-implanted silicon in the portions 121 of the hard mask layer 12. Analogously to the steps shown in FIGS. 1g and 1h, it is possible in this case, too, to continue the process sequence for the formation of a trench 26 in the coated substrate 10.

FIG. 3 shows, in a process sequence, the steps of a tone-identical process for trench formation. In this case, firstly in an exposure 40 (FIG. 3a) a gap 62 is formed in the photosensitive resist 16 (FIG. 3b).

Figure 3A:
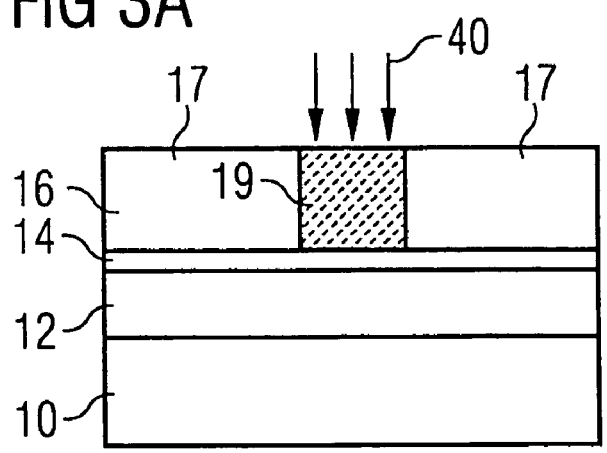
FIGS. 3a through 3g, shows a further exemplary embodiment according to the invention, but in which a tone-identical process is used.
Figure 3B:
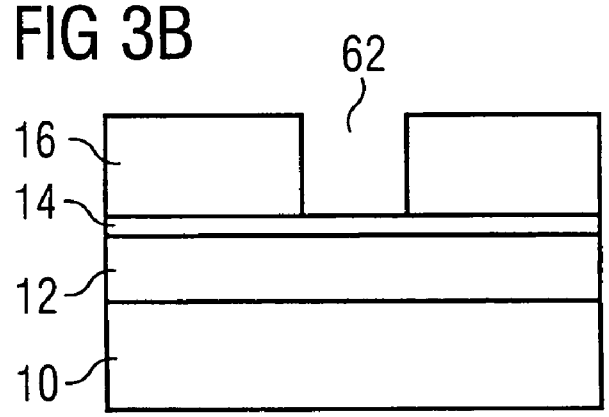
Figure 3C:
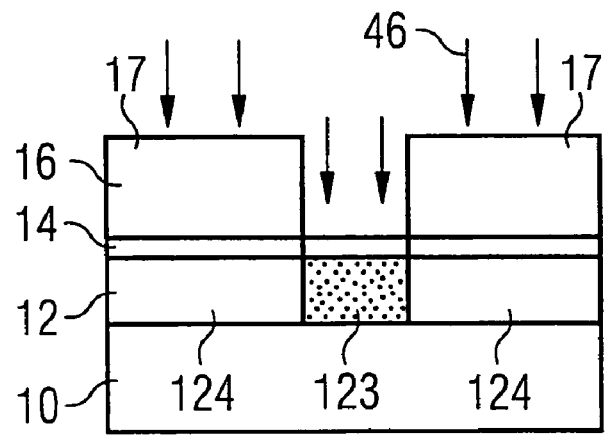
Figure 3D:
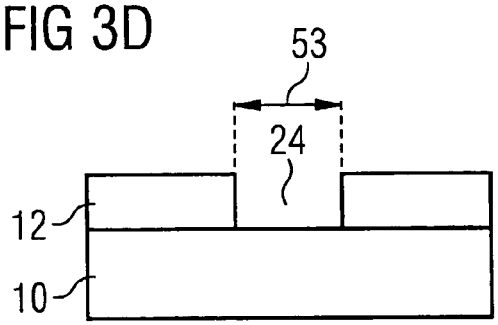

An implantation step 46 has the effect that the hard mask layer 12 is implanted with dopant particles beneath the gap 62 (first portion 123), while a second portion 124 of the hard mask layer 12 is shaded by the unexposed resist areas 17 (FIG. 3c). A selective etching process is then employed, which strips out precisely the first portion 123 of the hard mask layer 12 that has been implanted beforehand (FIG. 3b). The trench 24 formed in the hard mask layer 12 has a width 50 of 130 nm, for example. The exposure 40 was carried out using light having the wavelength 193 nm, in order to compensate for the optical effects that act disadvantageously in the present example in comparison with the exposure 40 shown in FIG. 1.

Figure 3E:
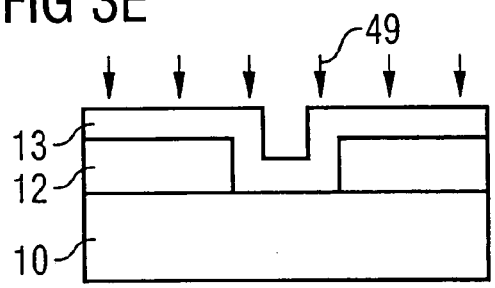
Figure 3F:
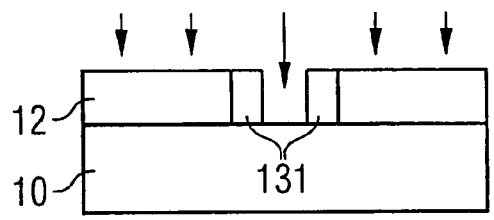
Figure 3G:
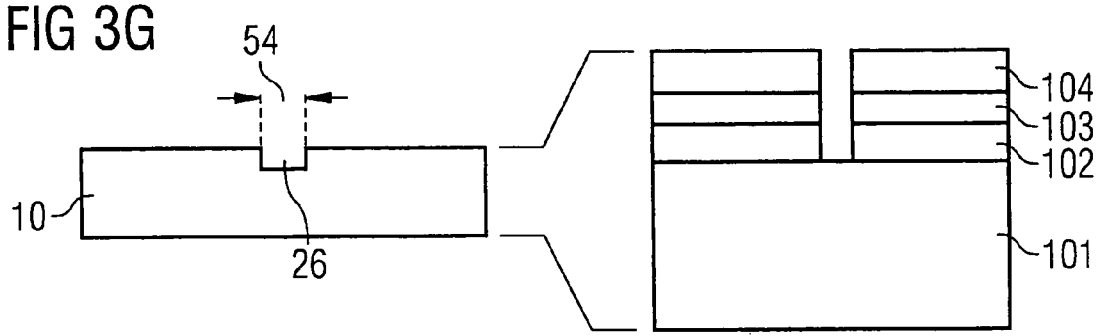

Afterward, a spacer material 13 is deposited and etched back anisotropically in an etching process 49 (FIG. 3e). Consequently, the spacers 131 shown in FIG. 3f remain at the sidewalls of the trench 24, which spacers consequently constrict the formerly comparatively wide trench 24 to form a narrower depression 26 having a width 54 of 80 nm, as can be seen in FIG. 3g.

LIST OF REFERENCE SYMBOLS

1 Semiconductor wafer
10 Coated substrate, comprising substrate and layer or layer stack
12 Hard mask layer
13 Deposited layer for spacer
14 Antireflection layer
16 Resist
17 Unexposed part of the resist
19 Exposed part of the resist
20 Resist ridge
22 Narrower resist ridge
24 Opening in hard mask layer 26 Trench in layer or layer stack
40 Exposure for projection of photo mask
42 Oxygen plasma, $O_2$ flash
46 Implantation
47 Oxidation
51 Width of the resist ridge after development
52 Width of the resist ridge after $O_2$ flash
53 Width of the opening in hard mask layer
54 Width of the trench in layer stack
62 Resist gap
101 Silicon substrate
102–104 Layer stack
121, 123 First, implanted and non-shaded portion of the hard mask layer
122, 124 Second, non-implanted and shaded portion of the hard mask layer
131 Spacer

What is claimed is:

1. A method for forming a semiconductor structure, the method comprising:
   providing a semiconductor wafer with a layer or a layer stack on which a hard mask layer and a photosensitive resist are arranged;
   exposing the photosensitive resist and developing the photoresist for the formation of at least one resist ridge arranged above the hard mask layer;
   reducing the width of the resist ridge by exposing the resist ridge to an oxygen plasma;
   implanting a first portion of the hard mask layer with dopant particles such that a second portion of the hard mask layer that is shaded by the resist ridge is not implanted;
   removing the resist ridge;
   stripping-out the second portion of the hard mask layer selectively with respect to the first portion to form an opening in the hard mask layer; and
   anisotropic etching the layer or the layer stack selectively with respect to the hard mask layer for the purpose of transferring the opening into the layer or the layer stack to form a recess.

2. The method as claimed in claim 1 wherein reducing the width of the resist ridge comprises exposing the resist ridge to an oxygen plasma.

3. The method as claimed in claim 1 wherein exposing the photoresist is carried out using light having a wavelength of 248 nanometers or more in such a way that the resist ridge, after development, takes up a first width within an interval having the limits of 110 nanometers and 130 nanometers.

4. The method as claimed in claim 1 wherein reducing the width of the resist ridge comprises reducing the width within an interval having the limits of 60 nanometers and 80 nanometers.

5. The method as claimed in claim 1 wherein:
   a photosensitive resist having a thickness is selected during the step of providing the semiconductor wafer; and
   implanting a first portion of the hard mask comprises using an implantation energy depending on the thickness of the resist.

6. The method as claimed in claim 1 wherein the thickness of the photoresist is at least 100 nanometers, and wherein implanting a first portion of the hard mask layer comprises implanting with an implantation energy between 1 keV and 10 keV.

7. The method as claimed in claim 1 wherein the hard mask layer comprises amorphous polysilicon.

8. The method as claimed in claim 7 wherein implanting a first portion of the hard mask layer comprises implanting a dopant selected from the group consisting of boron, boron fluoride, indium, arsenic, phosphorus, antimony, and combinations thereof.

9. The method as claimed in claim 8 wherein the stripping-out step is carried out using an alkaline etchant.

10. The method as claimed in claim 8 wherein the stripping-out step is carried out using $NH_4OH$ or KOH.

11. The method as claimed in claim 1 wherein the hard mask comprises silicon dioxide.

12. The method as claimed in claim 11 wherein implanting a first portion of the hard mask layer comprising implanting a dopant selected from the group consisting of fluorine and fluoride.

13. The method as claimed in claim 12 wherein the stripping-out step is carried out using HF, BHF or DHF.

14. The method as claimed in claim 1 wherein the hard mask comprises undensified aluminum oxide ($Al_2O_3$).

15. The method as claimed in claim 14 wherein implanting a first portion of the hard mask layer comprises implanting a dopant selected from the group consisting of argon and xenon.

16. The method as claimed in claim 15 wherein the anisotropic stripping-out step is carried out using SC1.

17. The method as claimed in claim 1 wherein the semiconductor wafer is provided with a layer stack, and the layer stack comprises a layer sequence at least of oxide-nitride-oxide.

18. The method as claimed in claim 1 wherein the hard mask layer comprises silicon and wherein nitrogen is used as dopant during the implantation step.

19. The method as claimed in claim 1 wherein the hard mask layer comprises amorphous polysilicon and wherein implanting with nitrogen and removing the resist ridge, an oxidation of the amorphous polysilicon that has not been implanted with nitrogen is carried out, and the oxidized, non-implanted polysilicon of the second portion is stripped out selectively with respect to the oxidized, implanted polysilicon of the first portion during the stripping-out step.

20. A method for forming a semiconductor structure, the method comprising:
   providing the semiconductor wafer with a layer or a layer stack on which a hard mask layer and a photosensitive resist are arranged;
   exposing the photosensitive resist and developing the photosensitive resist to form at least one resist gap above the hard mask layer, said gap being surrounded by unexposed resist regions;
   implanting a first portion of the hard mask layer below the resist gap with dopant particles, such that a second portion of the hard mask layer that is shaded by the photo is not implanted;
   removing the developed, unexposed resist regions;
   stripping-out the first portion of the hard mask layer that has been implanted below the resist gap selectively with respect to the second, non-implanted portion, to form an opening in the hard mask layer;
   depositing and etching-back a further layer, thereby forming a spacer that reduces a width of the opening; and
   anisotropic etching the layer or the layer stack selectively with respect to the hard mask layer for the purpose of transferring the opening having a reduced width into the layer or the layer stack.

* * * * *